US008866258B2

(12) United States Patent
Xia et al.

(10) Patent No.: US 8,866,258 B2
(45) Date of Patent: Oct. 21, 2014

(54) INTERPOSER STRUCTURE WITH PASSIVE COMPONENT AND METHOD FOR FABRICATING SAME

(75) Inventors: Wei Xia, Irvine, CA (US); Xiangdong Chen, Irvine, CA (US); Akira Ito, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 93 days.

(21) Appl. No.: 12/587,482

(22) Filed: Oct. 6, 2009

(65) Prior Publication Data

US 2011/0079917 A1     Apr. 7, 2011

(51) Int. Cl.
| | |
|---|---|
| *H01L 27/08* | (2006.01) |
| *H01L 23/498* | (2006.01) |
| *H01L 21/768* | (2006.01) |
| *H01L 21/48* | (2006.01) |
| *H01L 23/14* | (2006.01) |

(52) U.S. Cl.
CPC . *H01L 23/49827* (2013.01); *H01L 2924/15311* (2013.01); *H01L 23/49822* (2013.01); *H01L 21/76898* (2013.01); *H01L 21/486* (2013.01); *H01L 2224/16225* (2013.01); *H01L 23/147* (2013.01); *H01L 2223/6677* (2013.01)
USPC .................. 257/531; 257/774; 257/E21.022; 257/E23.011

(58) Field of Classification Search
USPC .................. 257/531, 774, E21.022, E23.011
See application file for complete search history.

(56) References Cited

U.S. PATENT DOCUMENTS

| | | | | |
|---|---|---|---|---|
| 6,493,861 | B1 * | 12/2002 | Li et al. ........................ | 716/137 |
| 7,230,318 | B2 * | 6/2007 | Kripesh et al. ................ | 257/621 |
| 2004/0159462 | A1 * | 8/2004 | Chung .......................... | 174/259 |
| 2006/0001179 | A1 * | 1/2006 | Fukase et al. ................ | 257/778 |
| 2008/0128882 | A1 * | 6/2008 | Baek et al. .................... | 257/686 |
| 2008/0197491 | A1 * | 8/2008 | Matsui ......................... | 257/737 |

* cited by examiner

*Primary Examiner* — Robert Huber
(74) *Attorney, Agent, or Firm* — McDermott Will & Emery LLP

(57) ABSTRACT

According to an exemplary embodiment, an interposer structure for electrically coupling a semiconductor die to a support substrate in a semiconductor package includes at least one through-wafer via extending through a semiconductor substrate, where the at least one through-wafer via provides an electrical connection between the semiconductor die and the support substrate. The interposer structure further includes a passive component including a trench conductor, where the trench conductor extends through the semiconductor substrate. The passive component further includes a dielectric liner situated between the trench conductor and the semiconductor substrate. The passive component can further include at least one conductive pad for electrically coupling the trench conductor to the semiconductor die. The passive component can be, for example, an inductor or an antenna.

20 Claims, 9 Drawing Sheets

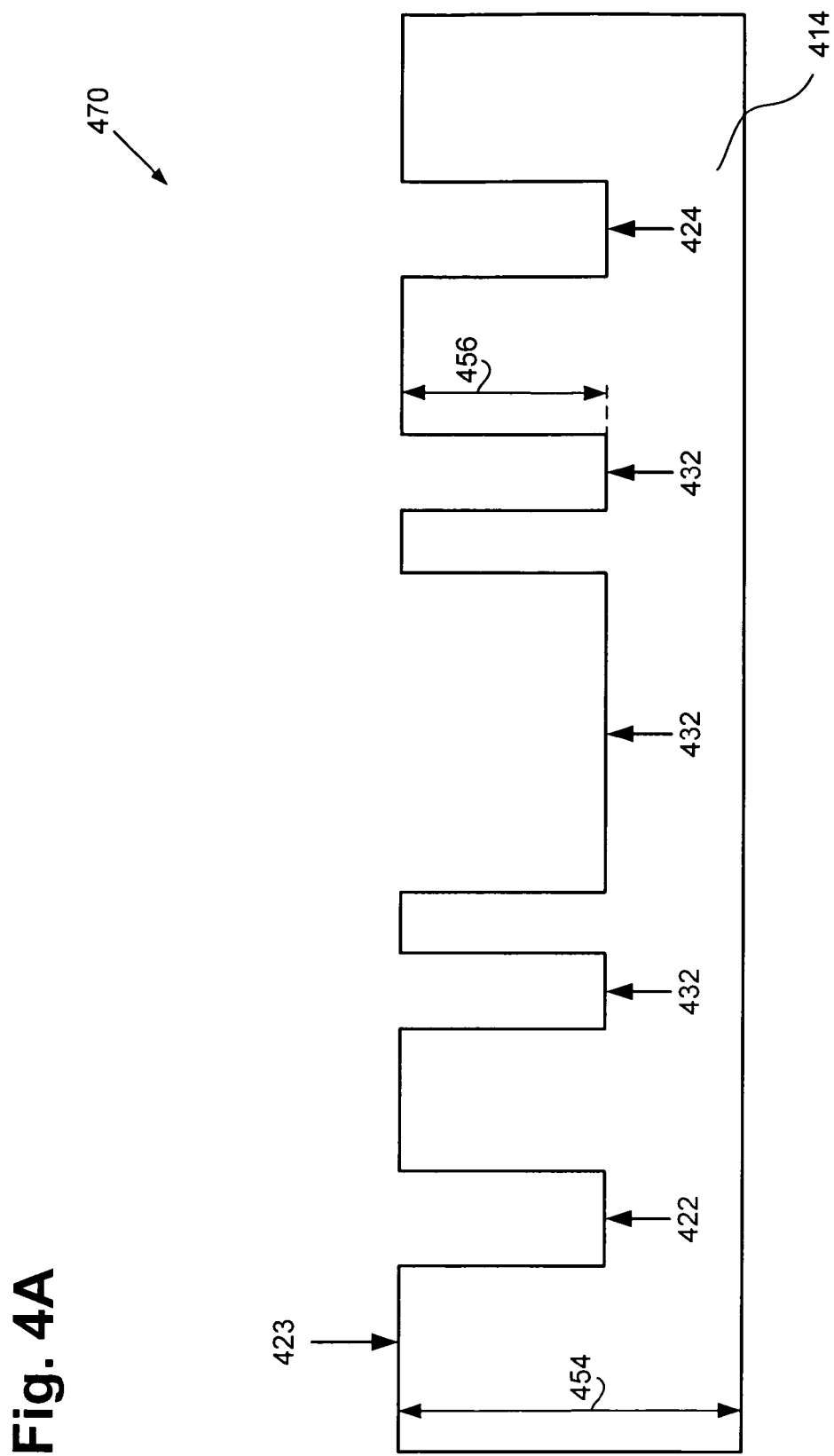

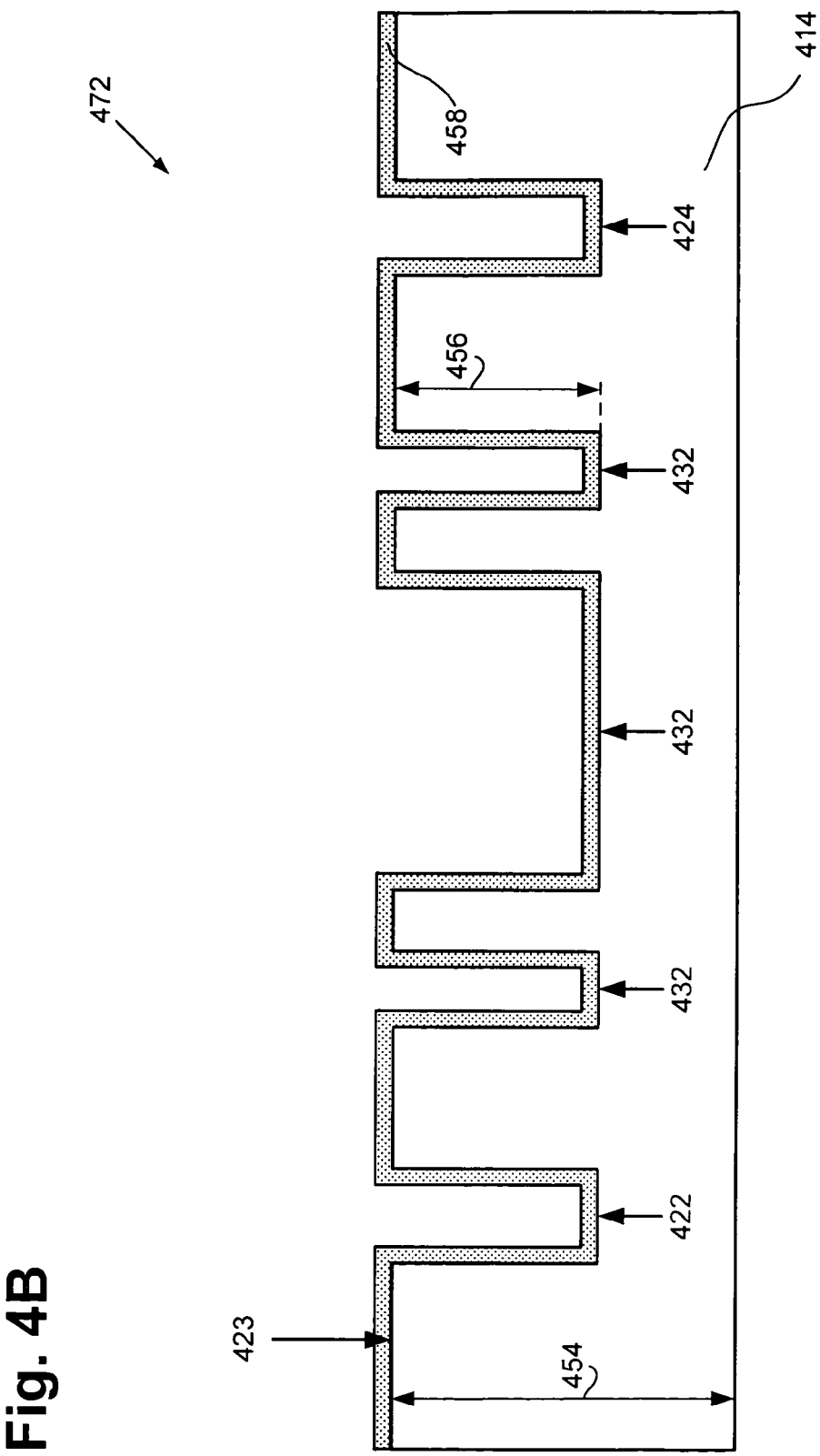

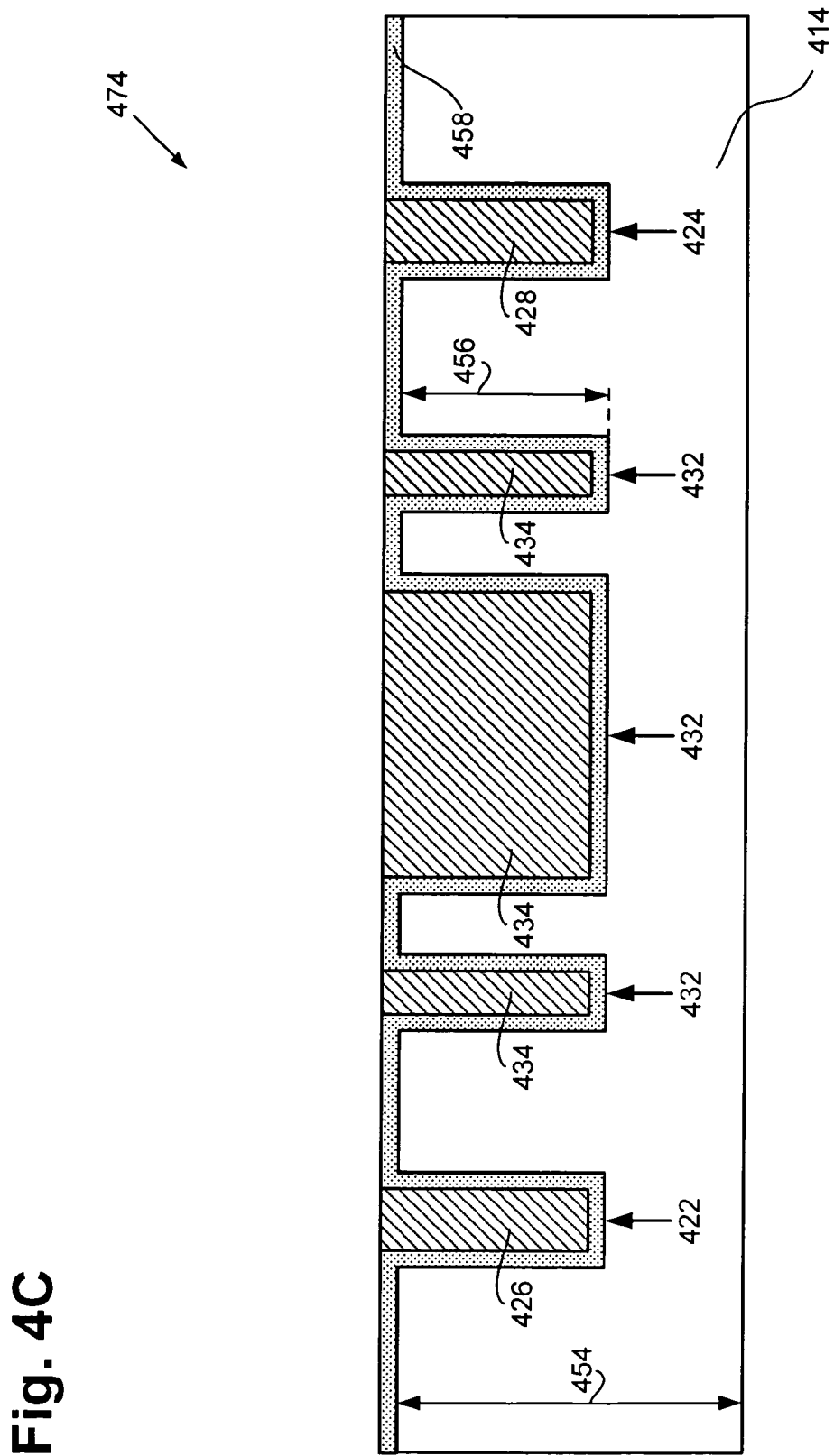

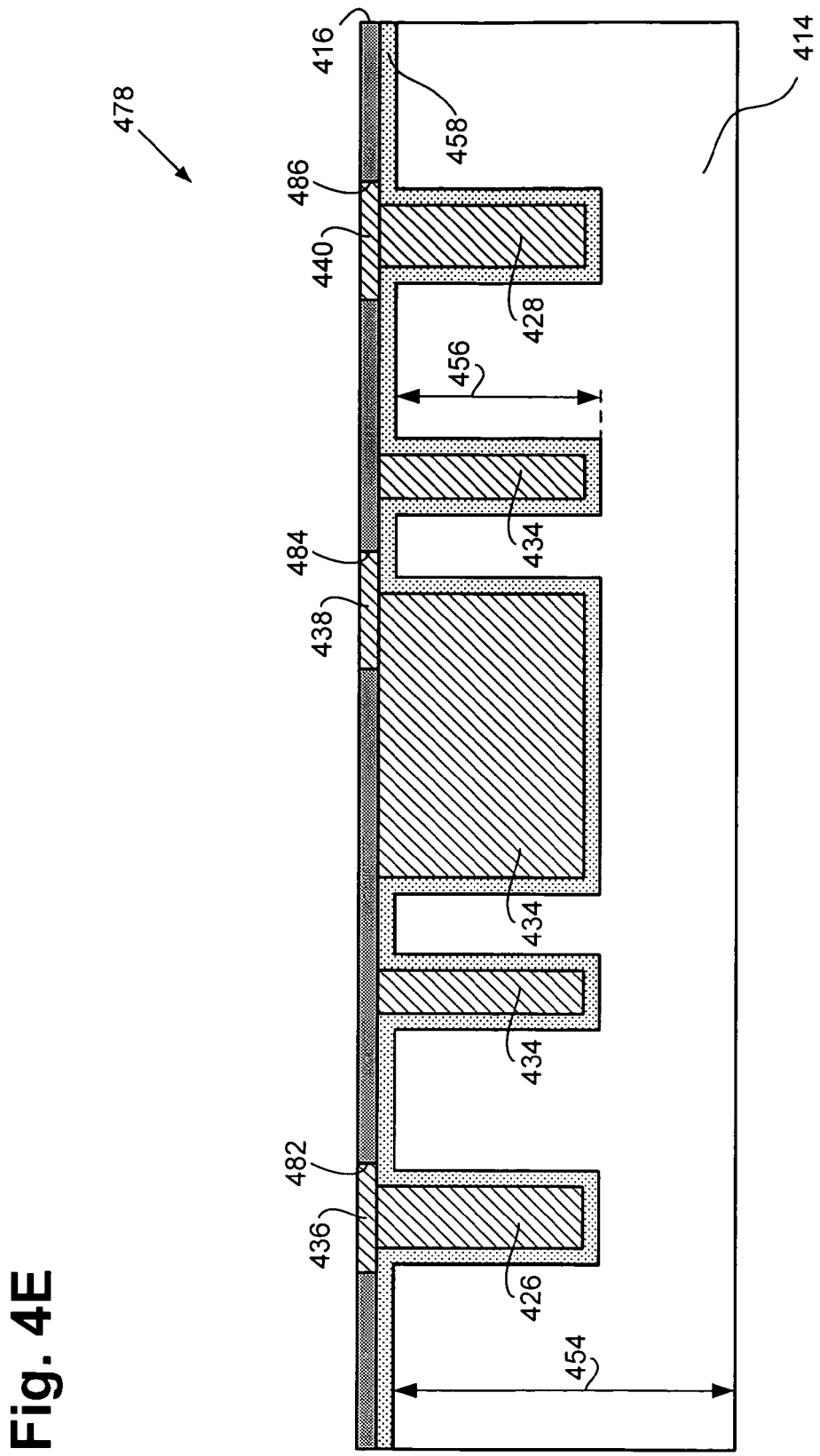

INTERPOSER STRUCTURE WITH PASSIVE COMPONENT AND METHOD FOR FABRICATING SAME

BACKGROUND OF THE INVENTION

1. Field of the Invention

The present invention generally relates to the field of semiconductors. More particularly, the invention relates to semiconductor packaging.

2. Background Art

A semiconductor package, such as a ball grid array (BGA) semiconductor package, can include a semiconductor die, an interposer structure, and a support substrate. The interposer structure typically includes a semiconductor substrate with through-wafer vias for electrically connecting the semiconductor die to the support substrate, such as a BGA support substrate. The interposer structure enables conductive pads having a narrow pitch on the semiconductor die to be electrically connected to conductive pads having a wide pitch on the support substrate. The semiconductor die can include an electronic circuit that requires a passive component, such as an inductor or antenna. Thus, it is desirable to provide an inductor or an antenna for a semiconductor die in a semiconductor package.

In a conventional on-chip solution, a passive component, such as an inductor or antenna, can be formed in the top metal layer of a semiconductor die in a semiconductor package. However, an on-chip passive component, such as an on-chip inductor or antenna, can consume an undesirably large amount of area on the semiconductor die. Additionally, forming an on-chip passive component can require additional processing steps, which can undesirably increase manufacturing cost.

In an alternative conventional solution, a passive component, such as an inductor or antenna, can be included in the semiconductor package as a discrete component, which can be, for example, mounted on the support substrate of the semiconductor package and electrically connected to the semiconductor die. However, the cost of a discrete passive component, such as a discrete inductor or antenna, can undesirably increase the cost of the semiconductor package.

SUMMARY OF THE INVENTION

Interposer structure with passive component and method for fabricating same, substantially as shown in and/or described in connection with at least one of the figures, as set forth more completely in the claims.

BRIEF DESCRIPTION OF THE DRAWINGS

FIG. 4A illustrates a cross-sectional view, which includes a portion of a wafer processed according to an embodiment of the invention, corresponding to an initial step in the flowchart in FIG. 3.

FIG. 4B illustrates a cross-sectional view, which includes a portion of a wafer processed according to an embodiment of the invention, corresponding to an intermediate step in the flowchart in FIG. 3.

FIG. 4C illustrates a cross-sectional view, which includes a portion of a wafer processed according to an embodiment of the invention, corresponding to an intermediate step in the flowchart in FIG. 3.

FIG. 4E illustrates a cross-sectional view, which includes a portion of a wafer processed according to an embodiment of the invention, corresponding to an intermediate step in the flowchart in FIG. 3.

DETAILED DESCRIPTION OF THE INVENTION

The present invention is directed to an interposer structure with passive component and method for fabricating same. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings.

Figure 1:
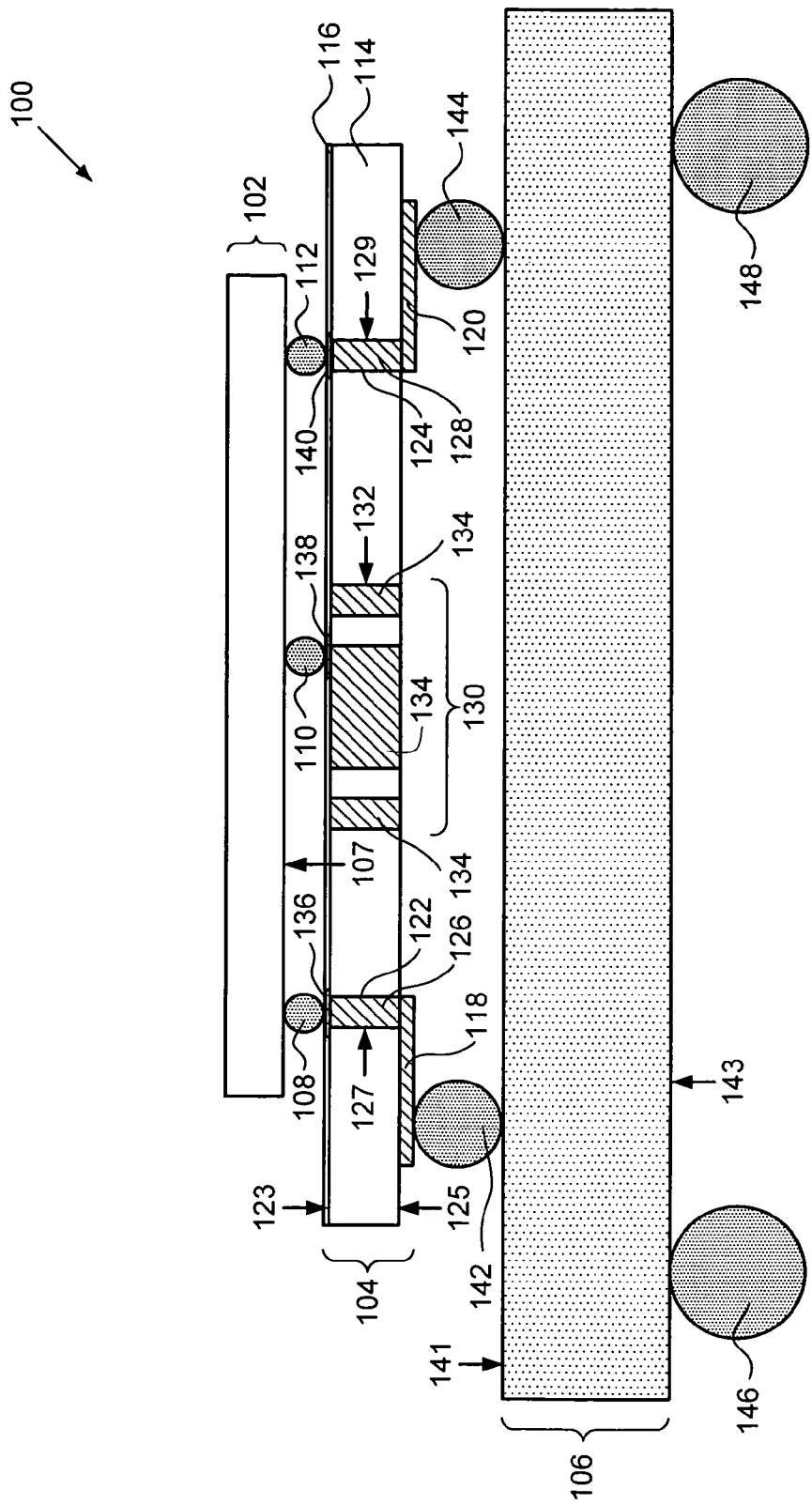
FIG. 1 illustrates a cross-sectional view of an exemplary semiconductor package including an exemplary interposer structure in accordance with one embodiment of the present invention.

FIG. 1 illustrates a cross-sectional view of an exemplary semiconductor package including an exemplary interposer structure in accordance with one embodiment of the present invention. Semiconductor package 100 includes semiconductor, die 102, interposer structure 104, and support substrate 106. Semiconductor die 102 can be, for example, an integrated circuit (IC) chip.

As shown in FIG. 1, semiconductor die 102 is electrically connected to interposer structure 104 by solder bumps 108, 110 and 112. Semiconductor die 102 can utilize flip chip packaging technology, wherein the die can be "flipped" to allow solder bumps, such as solder bumps 108, 110, and 112, on active surface 107 of the die to make direct electrical contact with interposer structure 104. Solder bumps 108, 110, and 112 can be formed on respective contact pads (not shown in FIG. 1) situated on active surface 107 of semiconductor die 102. Solder bumps 180, 110, and 112 can comprise an electrically conductive material, such as metal or a metal alloy. Interposer structure 104 can be configured to increase the pitch of solder bumps, such as solder bumps 108, 110, and 112, on active surface 107 of semiconductor die 102.

Further shown in FIG. 1, interposer structure 104 includes interposer substrate 114, dielectric layer 116, and conductive segments 118 and 120. Interposer structure 104 further includes through-wafer vias 127 and 129 and passive component 130, which can extend through interposer substrate 114. Interposer substrate 114 can be a semiconductor substrate and has top surface 123 and bottom surface 125. Through-wafer via 127 includes through-wafer via opening 122 (also referred to simply as a "via opening" in the present application), through-wafer via conductor 126 (also referred to simply as a "via conductor" in the present application) and conductive pad 136. Through-wafer via 129 includes via opening 124, via conductor 128, and conductive pad 140. Passive component 130 includes trench opening 132, trench conductor 134, and conductive pads, such as conductive pad 138, formed on the ends of trench conductor 134. Passive component 130 can be, for example, an inductor. In one embodiment, passive component 130 can be an antenna. In such embodiment, passive component 130 can include only one conductive pad, which can be electrically connected to one end of the antenna. Through-wafer vias 127 and 129 and passive component 130 also include a dielectric liner, which is not shown in FIG. 1.

Also shown in FIG. 1, trench conductor 134 is situated in trench opening 132, which extends through interposer substrate 114. Similarly, via conductors 126 and 128 are situated in respective via openings 122 and 124, which also extend through interposer substrate 114. Further shown in FIG. 1, dielectric layer 116 and conductive pads 136, 138, and 140 are situated on top surface 123 of interposer substrate 114. Conductive pads 136, 138, and 140 are formed on top surface 123 of interposer substrate 114 in respective openings in dielectric layer 116. Conductive pads 136, 138 and 140 electrically couple solder bumps 108, 110, and 112 to via conductor 126, trench conductor 134, and via conductor 128, respectively.

Also shown in FIG. 1, via conductors 126 and 128 are electrically coupled to respective solder balls 142 and 144 by respective conductive segments 118 and 120. Conductive segments 118 and 120 can comprise copper or other metal or a metal stack. As shown, conductive segments 118 and 120 are situated on the bottom surface of interposer substrate 114. Conductive segments 118 and 120 are utilized to expand the pitch of solder bumps 108 and 112 on active surface 107 of semiconductor die 102.

Further shown in FIG. 1, support substrate 106 underlies and is electrically coupled to interposer structure 104 by solder balls, such as solder balls 142 and 144. Support substrate 106 can be a BGA substrate and can comprise, for example, a laminate material such as FR4 or other suitable dielectric material as is known in the art. Support substrate 106 can include conductive vias, pads, and segments (not shown in FIG. 1) for electrically coupling solder balls, such as solder balls 142 and 144, situated on top surface 141 of the support substrate to respective solder balls, such as solder balls 146 and 148, situated on bottom surface 143 of the support substrate.

Certain details and features have been omitted from semiconductor package 100 that would be apparent to a person of ordinary skill in the art. It is noted that while only through-wafer vias 127 and 129 are shown to preserve brevity, interposer structure 104 can include as many through-wafer vias as are necessary to electrically couple conductive pads on active surface 107 of semiconductor 102 to support substrate 106. In an embodiment of the invention, interposer structure 104 can include multiple passive components, such as passive component 130, where each passive component includes a trench conductor formed in a corresponding trench in the interposer substrate.

Thus, an embodiment of the invention can provide a passive component, such as an inductor, in a semiconductor substrate of an interposer structure that conventionally includes only through-wafer vias. By providing a passive component, such as an inductor, in an interposer structure, an embodiment of the invention can utilize available space on the interposer structure so as to form an on-chip passive component, such as an on-chip inductor. In one embodiment, the invention can provide a passive component, such as an antenna, in the interposer structure. Thus, an embodiment of the invention can provide an on-chip passive component in an interposer structure in a semiconductor package while advantageously avoiding the cost and complexity of forming a passive component, such as an inductor or antenna, on a semiconductor die in the semiconductor package. Furthermore, by providing a passive component on an interposer structure, an embodiment of the invention advantageously avoids the cost of providing a discrete passive component in the semiconductor package.

Figure 2:
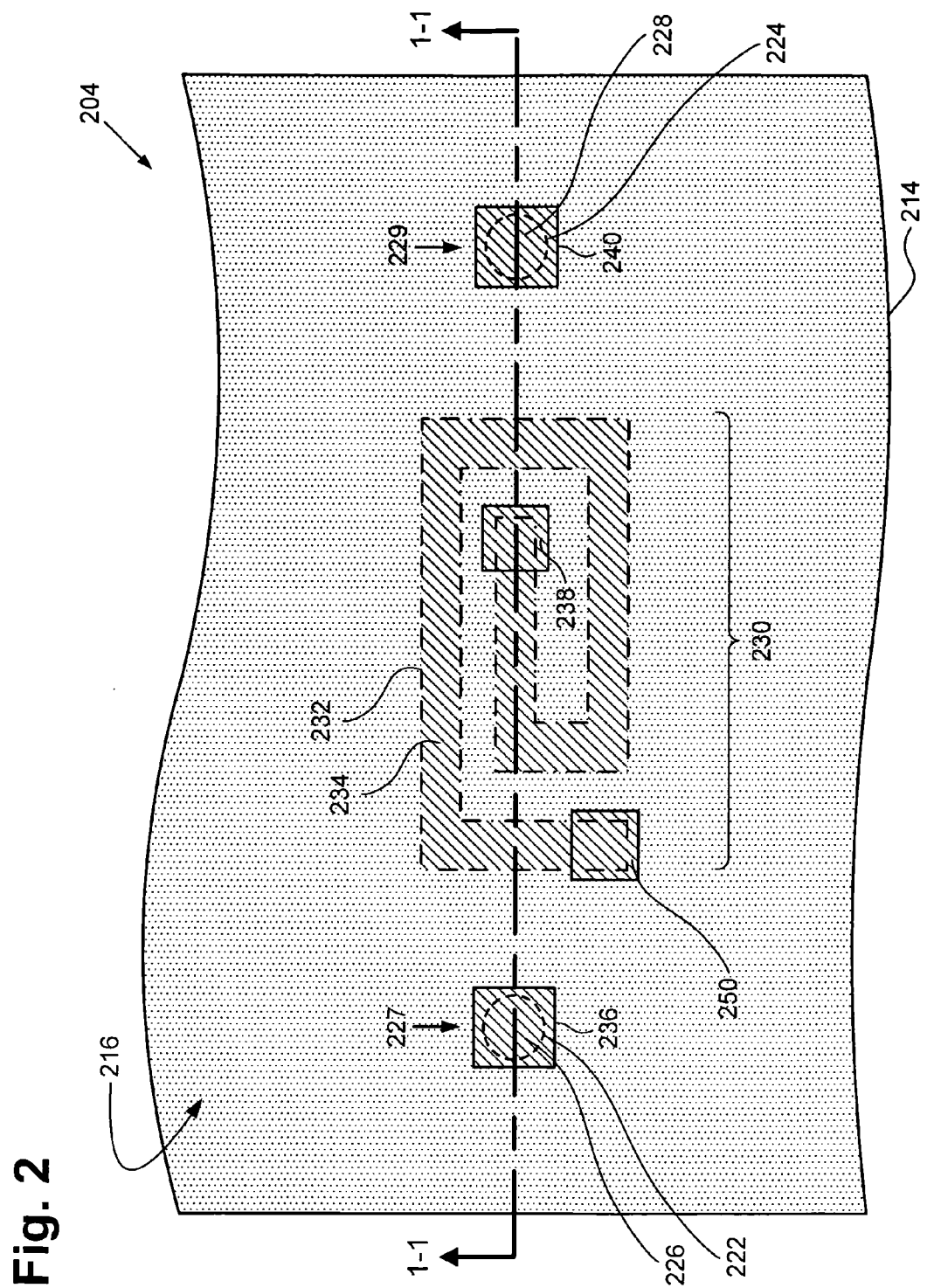
FIG. 2 illustrates a top view of a portion of an exemplary interposer structure in the exemplary semiconductor package in FIG. 1.

Referring now to FIG. 2, a top view of a portion of interposer structure 104 in semiconductor package 100 in FIG. 1 is illustrated. More particularly, FIG. 2 shows interposer structure 204, which corresponds to interposer structure 104 in FIG. 1. Interposer structure 104 is shown as a cross-sectional view of interposer structure 204 along line 1-1. In FIG. 2, interposer substrate 214, dielectric layer 216, via openings 222 and 224, via conductor 226 and 228, through-wafer vias 227 and 229, passive component 230, trench opening 232, trench conductor 234, and conductive pads 236, 238 and 240 correspond, respectively, to interposer substrate 114, dielectric layer 116, via openings 122 and 124, via conductor 126 and 128, through-wafer vias 127 and 129, passive component 130, trench opening 132, trench conductor 134, and conductive pads 136, 138 and 140 in FIG. 1.

As shown in FIG. 2, through-wafer vias 227 and 229 include respective via openings 222 and 224, which extend through interposer substrate 214. Also shown in FIG. 2, conductive pads 236 and 240 are situated on respective via conductors 226 and 228. Conductive pads 236 and 240 are situated in openings in dielectric layer 216 and can be electrically connected to solder bumps on the active surface of an overlying semiconductor die, such as solder bumps 108 and 112 on active surface 107 of semiconductor die 102 in FIG. 1.

Further shown in FIG. 2, passive component 230 includes trench opening 232, trench conductor 234, conductive pads 238 and 250. In the present embodiment, passive component 230 can be an inductor with conductive pads 238 and 250 configured as terminals. It another embodiment, passive component 230 can be an antenna having a single pad electrically connected to an end of the antenna. Trench opening 232 underlies dielectric layer 216 and extends through interposer substrate 214. In the present embodiment, trench opening 232 can have a spiral shape. In other embodiments of the invention, trench opening 232 can have a different shape, such as a circular shape, a square shape, or a rectangular shape.

Also shown in FIG. 2, trench conductor 234 is situated in trench opening 232 and conductive pads 238 and 250 are situated on respective ends of trench conductor 234. Conductive pads 238 and 250 can be electrically connected to solder bumps on the active surface of an overlying semiconductor die. For example, conductive pad 238 can be electrically connected to solder bump 110 and conductive pad 250 can be electrically connected to another solder bump (not shown in FIG. 1) on active surface 107 of semiconductor die 102.

Figure 3:
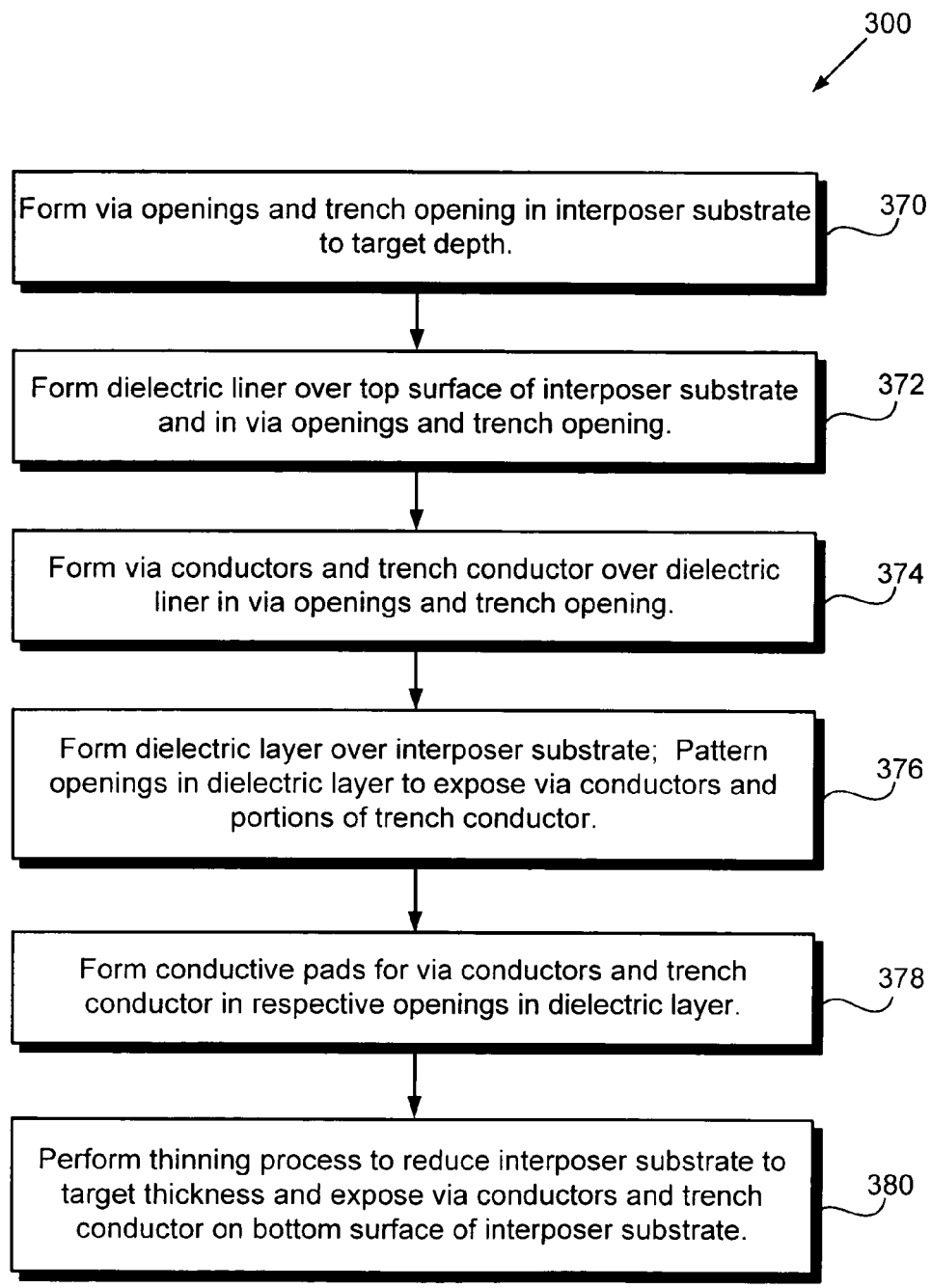
FIG. 3 shows a flowchart illustrating the steps taken to implement an embodiment of the present invention.

Now referring to FIG. 3, an exemplary flow chart is shown illustrating a method according to one embodiment of the present invention. Certain details and features have been left out of flowchart 300 that are apparent to a person of ordinary skill in the art. For example, a step may consist of one or more substeps or may involve specialized equipment or materials, as known in the art. Steps 370 through 380 indicated in flowchart 300 are sufficient to describe an embodiment of the present invention; however, other embodiments of the invention may utilize steps different from those shown in flowchart 300.

Moreover, structures 470 through 480 in FIGS. 4A through 4F illustrate the result of performing steps 370 through 380 of flowchart 300, respectively. For example, structure 470 shows a semiconductor structure after processing step 370, structure 472 shows structure 470 after the processing of step 372, structure 474 shows structure 472 after the processing of step 374, and so forth.

Referring now to step 370 in flowchart 300 and structure 470 in FIG. 4A, at step 370 of flowchart 300, via openings 422 and 424 and trench opening 432 are formed in interposer substrate 414 to target depth 456. In Structure 470 of FIG. 4A, interposer substrate 414 can be a semiconductor substrate, such as silicon substrate, and has top surface 423 and initial thickness 454. Interposer substrate 414 includes via openings 422 and 424, which correspond to respective via openings 122 and 124 in FIG. 1 and respective via openings 222 and 224 in FIG. 2. Interposer substrate 414 also includes trench opening 432, which corresponds to trench opening 132 in FIG. 1 and trench opening 232 in FIG. 2. Via openings 422 and 424 and trench opening 432 each extend through interposer substrate 414 to target depth 456.

Via openings 422 and 424 and trench opening 432 can be formed, for example, by forming a layer of masking material (not shown in FIG. 4A) over top surface 423 of interposer substrate 414 and patterning appropriate openings in the layer of masking material to form a mask. The layer of masking material can comprise, for example, photoresist or other suitable masking material. The patterned openings can then be extended into interposer substrate 414 to target depth 456 by utilizing a reactive ion etch (RIE) process or other suitable etch process. Thus, in an embodiment of the invention, via openings 422 and 424 and trench opening 432 can be formed by utilizing a single mask.

Referring to step 372 in flowchart 300 and structure 472 in FIG. 4B, at step 372 of flowchart 300, dielectric liner 458 is formed over top surface 423 of interposer substrate 414, in via openings 422 and 424, and in trench opening 432. As shown in FIG. 4B, dielectric liner 458 is situated in via openings 422 and 424 and trench opening 432 and can comprise silicon oxide or other dielectric material. Dielectric liner 458 can be formed, for example, by utilizing a thermal oxidation process, a chemical vapor deposition (CVD) process, or other deposition process as is known in the art.

Referring to step 374 in flowchart 300 and structure 474 in FIG. 4C, at step 374 of flowchart 300, via conductors 426 and 428 and trench conductor 434 are formed over dielectric liner 458 in via openings 422 and 424 and trench opening 432, respectively. As shown in FIG. 4C, via conductors 426 and 428 and trench conductor 434 are situated over dielectric liner 458 in via openings 422 and 424 and trench opening 432, respectively. In FIG. 4C, via conductors 426 and 428 correspond, respectively, to via conductors 126 and 128 in FIG. 1 and to via conductors 226 and 228 in FIG. 2. Also, trench conductor 434 corresponds to trench conductor 134 in FIG. 1 and trench conductor 234 in FIG. 2. Trench conductor 434 can form a conductive portion of a passive component, such as an inductor. In one embodiment, trench conductor 434 can form a conductive portion of a passive component, such as an antenna.

Via conductors 426 and 428 and trench conductor 434 can be formed, for example, by forming a conductive layer (not shown in FIG. 4C) over dielectric liner 458 and in through-wafer via openings 422 and 424 and trench opening 432. The conductive layer can comprise, for example, copper, aluminum, or other metal or metal stack. The conductive layer can be formed, for example, by depositing a layer of metal, such as a layer of copper, over dielectric liner 458 by utilizing a physical vapor deposition (PVD) process, a CVD process, or other deposition process. After the conductive layer has been deposited, a planarizing process can be performed to remove excess portions of the conductive layer so as to expose dielectric liner 458. The planarizing process can comprise, for example, a chemical-mechanical polishing (CMP) process.

Figure 4D:
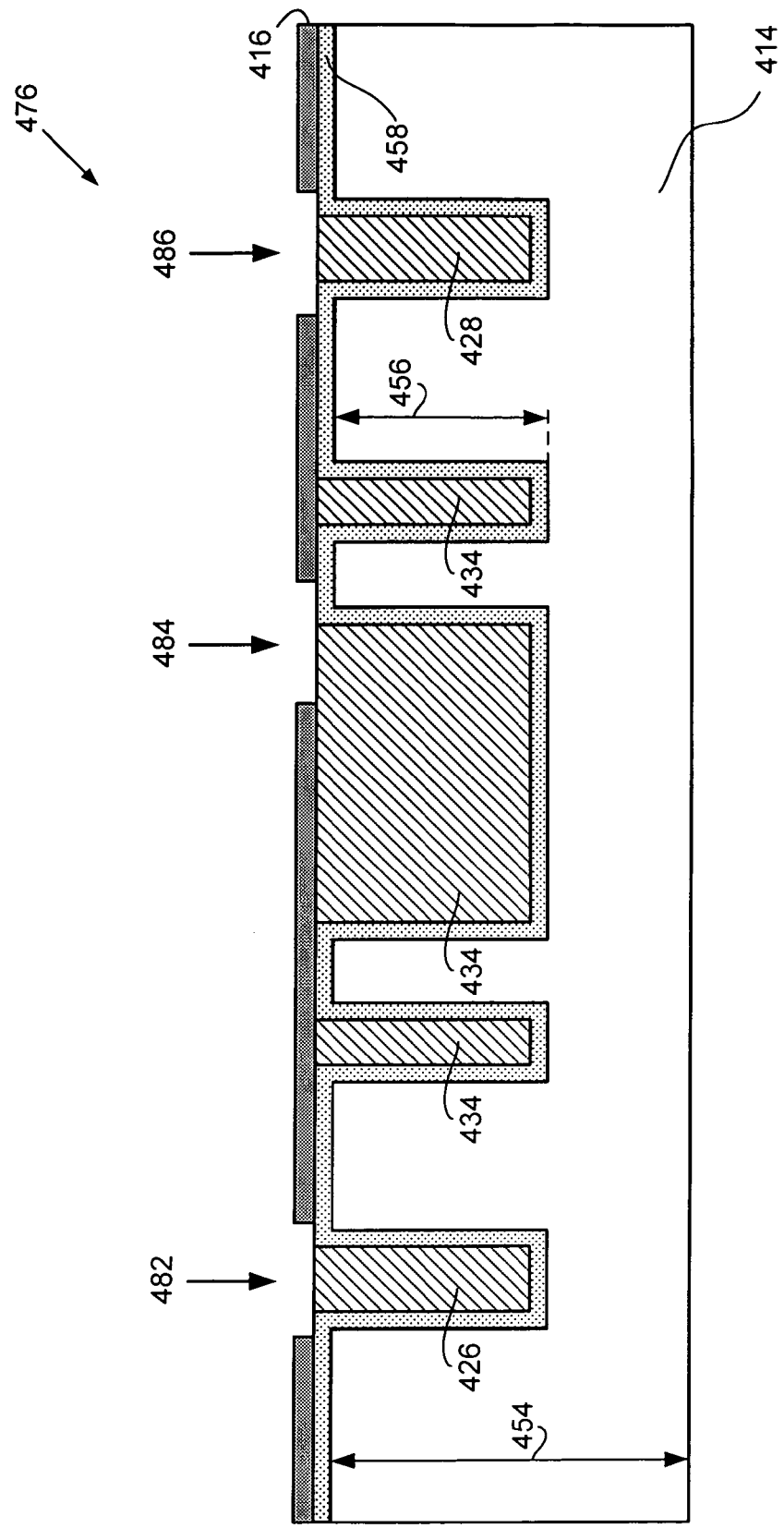
FIG. 4D illustrates a cross-sectional view, which includes a portion of a wafer processed according to an embodiment of the invention, corresponding to an intermediate step in the flowchart in FIG. 3.

Referring to step 376 in flowchart 300 and structure 476 in FIG. 4D, at step 376 of flowchart 300, dielectric layer 416 is formed over interposer substrate 414 and openings 482, 484, and 486 are patterned in dielectric layer 416 to expose via conductors 426 and 428 and a portion of trench conductor 434. In FIG. 4D, dielectric layer 416 corresponds to dielectric layer 116 in FIG. 1 and dielectric layer 216 in FIG. 2. Dielectric layer 416 can comprise, for example, silicon nitride, or other dielectric material and can have a thickness of, for example, between approximately 300.0 Angstroms and approximately 1000.0 Angstroms in an embodiment of the invention. Openings 482, 484, and 486 in dielectric layer 416 are situated over via conductors 426 and 428 and trench conductor 434, respectively. Dielectric layer 416 can be formed, for example, by depositing a layer of silicon nitride over interposer substrate 414 by utilizing a CVD process or other deposition process.

Referring to step 378 in flowchart 300 and structure 478 in FIG. 4E, at step 378 of flowchart 300, conductive pads 436, 438 and 440 are formed in respective openings 482, 484 and 486 in dielectric layer 416. In FIG. 4E, conductive pads 436, 438 and 440 correspond to conductive pads 136, 138 and 140 in FIG. 1 and conductive pads 236, 238 and 240 in FIG. 2, respectively. As shown in FIG. 4E, conductive pads 436 and 440 are situated over via Conductors 426 and 428 and conductive pad 438 is situated over trench conductor 434. Conductive pads 436, 438 and 440 can be formed, for example, by depositing a conductive layer (not shown in FIG. 4E) over dielectric layer 416 and over via conductors 426 and 428 and trench conductor 434 by utilizing a PVD process, a CVD process or other deposition process. After the conductive layer has been deposited, a planarizing process, such as a CMP process, can be performed to expose dielectric layer 416.

Figure 4F:
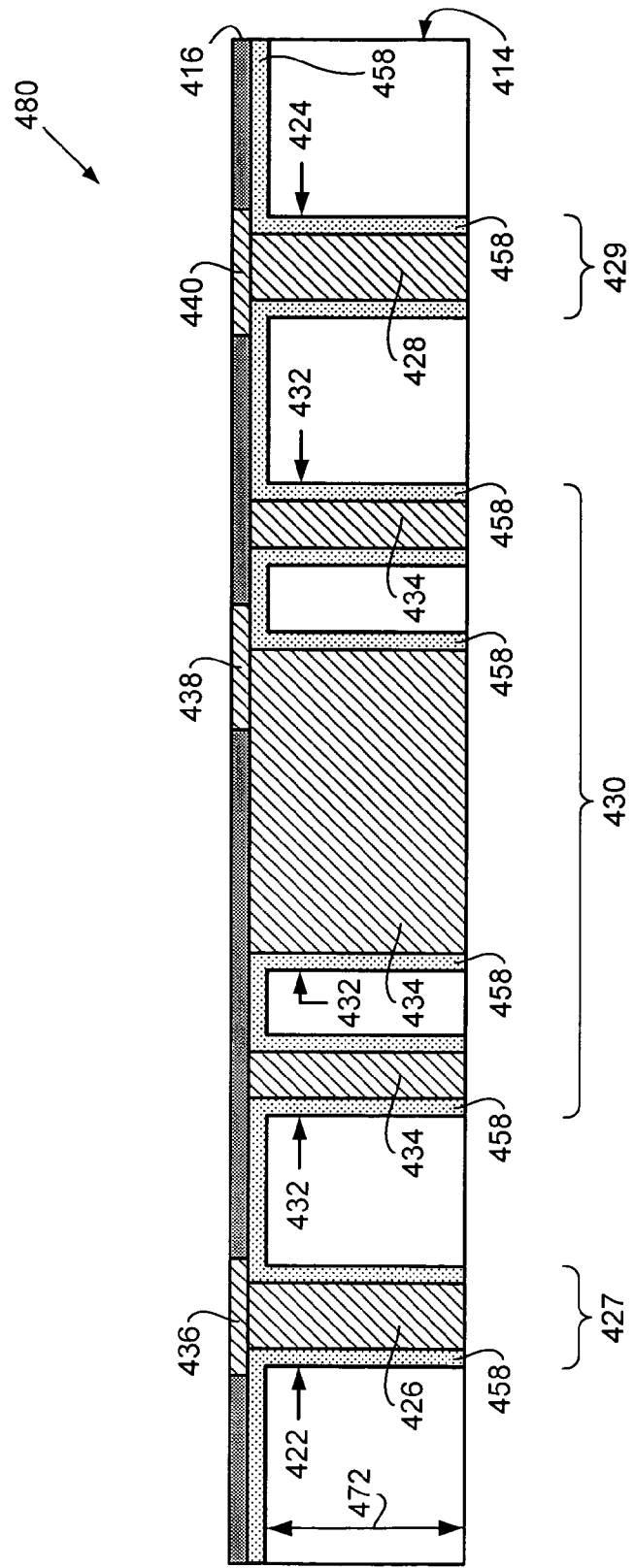
FIG. 4F illustrates a cross-sectional view, which includes a portion of a wafer processed according to an embodiment of the invention, corresponding to a final step in the flowchart in FIG. 3.

Referring to step 380 in flowchart 300 and structure 480 in FIG. 4F, at step 380 of flowchart 300, a thinning process is performed to reduce the thickness of interposer substrate 414 to target thickness 472 and to expose via conductors 426 and 428 and trench conductor 434 on bottom surface 441 of interposer substrate 414. The thinning process can comprise, for example, a backgrinding CMP process to reduce the thickness of interposer substrate 414 to target thickness 472. After the thinning process, structure 480 includes through-wafer vias 427 and 429 and passive component 430. In FIG. 4F, through-wafer vias 427 and 429 and passive component 430 correspond, respectively, to through-wafer vias 127 and 129 and passive component 130 in FIG. 1.

As shown in FIG. 4F, through-wafer via 427 includes via conductor 426, dielectric liner 458, via opening 422 and conductive pad 436 and through-wafer via 429 includes via conductor 428, dielectric liner 458, via opening 424 and conductive pad 440. Also shown in FIG. 4f, passive component 430 includes trench conductor 434, dielectric liner 458, trench opening 432 and conductive pad 438. Although not shown in FIG. 4F, conductive segments can be formed on the bottom surface of structure 480, such as conductive segments 118 and 120 on bottom surface 125 of interposer structure 104 in FIG. 1.

Thus, as discussed above, an embodiment of the invention can provide a passive component, such as an inductor or antenna, in an interposer structure in a semiconductor package, where the passive component can extend through the interposer substrate (i.e. a semiconductor substrate), and where the passive component can be electrically connected to a semiconductor die in the semiconductor package. By forming a passive component, such as an inductor or antenna, in an interposer structure, an embodiment of the invention advantageously provides a passive component that can be electrically connected to the semiconductor die while advantageously avoiding the cost and die area require to provide the passive component on the semiconductor die.

Also, by forming a passive component, such as an inductor or antenna, in an interposer structure in a semiconductor package, an embodiment of the invention advantageously provides a passive component, such as an inductor or antenna, for a semiconductor package while avoiding the cost of a discrete passive component, such as a discrete inductor or antenna.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. An interposer structure for electrically coupling a semiconductor die to a support substrate in a semiconductor package, said interposer structure comprising:
    at least one through-wafer via extending through a semiconductor substrate, said at least one through-wafer via providing an electrical connection between said semiconductor die and said support substrate;
    conductive segments having a pitch substantially wider than said at least one through-wafer via, disposed on a bottom surface of said semiconductor substrate and electrically connecting said at least one through-wafer via to said support substrate;
    a passive component comprising a trench conductor, said trench conductor extending through said semiconductor substrate without electrically coupling said semiconductor die to said support substrate;
    a plurality of conductive pads, each disposed on a top surface of said semiconductor substrate that is opposite the bottom surface and coupling one of said at least one through-wafer via and said passive component to said semiconductor die; and
    a dielectric liner disposed between said semiconductor substrate and each of said at least one through-wafer via and said passive component;
    wherein each of said at least one through-wafer via and said passive component is completely electrically isolated from said semiconductor substrate; and
    wherein a first terminal is situated on one end of the passive component and a second terminal is situated on another end of the passive component, the first and second terminals being on the top surface of said semiconductor substrate.

2. The interposer structure of claim 1, wherein said passive component is electrically coupled to said semiconductor die by at least one solder bump.

3. The interposer structure of claim 1, wherein said passive component is an inductor.

4. The interposer structure of claim 1, wherein said passive component is an antenna.

5. The interposer structure of claim 1, wherein said trench conductor has a spiral shaped trench.

6. The interposer structure of claim 1 further comprising a dielectric layer situated over said trench conductor.

7. The interposer structure of claim 1, wherein said trench conductor is exposed on the bottom surface of said semiconductor substrate.

8. The interposer structure of claim 1, wherein said support substrate comprises a ball grid array substrate.

9. An interposer structure for electrically coupling a semiconductor die to a support substrate in a semiconductor package, said interposer structure comprising:
    at least one through-wafer via extending through a semiconductor substrate, said at least one through-wafer via providing an electrical connection between said semiconductor die and said support substrate;
    conductive segments having a pitch substantially wider than said at least one through-wafer via, disposed on a bottom surface of said semiconductor substrate and electrically connecting said at least one through-wafer via to said support substrate;
    an inductor or antenna within said semiconductor substrate without electrically coupling said semiconductor die to said support substrate;
    a plurality of conductive pads, each disposed on a top surface of said semiconductor substrate that is opposite the bottom surface and coupling one of said at least one through-wafer via to said semiconductor die; and
    a dielectric liner disposed between said semiconductor substrate and each of said at least one through-wafer via and said inductor or antenna;
    wherein each of said at least one through-wafer via and said inductor or antenna is completely electrically isolated from said semiconductor substrate; and
    wherein a first terminal is situated on one end of the inductor or antenna and a second terminal is situated on an opposite end of the inductor or antenna, the first and second terminals being on the top surface of said semiconductor substrate.

10. The interposer structure of claim 9, wherein said inductor or antenna is electrically coupled to said semiconductor die by at least one solder bump.

11. The interposer structure of claim 9, wherein said inductor or antenna has a spiral shaped trench.

12. The interposer structure of claim 9 further comprising a dielectric layer situated over said inductor or antenna.

13. The interposer structure of claim 1, wherein the first and second terminals are configured to electrically couple said passive component to said semiconductor die.

14. The interposer structure of claim 1, wherein said trench conductor is situated in a trench opening in said semiconductor substrate, said trench opening having a narrow extent lateral to a top surface of said interposer structure.

15. The interposer structure of claim 1, wherein said trench conductor is situated in a trench opening, said trench opening having a spiral shaped opening within said interposer structure.

16. The interposer structure of claim 1, wherein:
- a first conductive pad of the plurality of conductive pads is configured as the first terminal of the passive component, and
- a second conductive pad of the plurality of conductive pads is configured as the second terminal of the passive component.

17. The interposer structure of claim 16, wherein the first and second conductive pads are situated on respective ends of the trench conductor.

18. The interposer structure of claim 9, wherein the first and second terminals are configured to electrically couple the inductor or antenna to the semiconductor die.

19. The interposer structure of claim 9, wherein:
- a first conductive pad of the plurality of conductive pads is configured as the first terminal of the inductor or antenna, and
- a second conductive pad of the plurality of conductive pads is configured as the second terminal of the inductor or antenna.

20. The interposer structure of claim 19, wherein the first and second conductive pads are situated on respective ends of a trench conductor.

* * * * *